(12) United States Patent
Lee et al.

(10) Patent No.: US 9,269,839 B2
(45) Date of Patent: Feb. 23, 2016

(54) SOLAR CELL AND METHOD OF MANUFACTURING THE SAME

(71) Applicant: LG ELECTRONICS INC., Seoul (KR)

(72) Inventors: Hyunho Lee, Seoul (KR); Kyoungsoo Lee, Seoul (KR); Changseo Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 97 days.

(21) Appl. No.: 14/038,159

(22) Filed: Sep. 26, 2013

(65) Prior Publication Data

US 2014/0083498 A1    Mar. 27, 2014

(30) Foreign Application Priority Data

Sep. 27, 2012  (KR) .................. 10-2012-0108061

(51) Int. Cl.
| | |
|---|---|
| H01L 31/044 | (2014.01) |
| H01L 31/0216 | (2014.01) |
| H01L 31/0224 | (2006.01) |
| H01L 31/0368 | (2006.01) |
| H01L 31/068 | (2012.01) |

(52) U.S. Cl.
CPC .. *H01L 31/02167* (2013.01); *H01L 31/022441* (2013.01); *H01L 31/03682* (2013.01); *H01L 31/068* (2013.01); *Y02E 10/546* (2013.01); *Y02E 10/547* (2013.01)

(58) Field of Classification Search
CPC ........ H01L 31/00–31/078; Y02E 10/50–10/60
USPC .................................. 136/243–265
See application file for complete search history.

(56) References Cited

U.S. PATENT DOCUMENTS

| | | | |
|---|---|---|---|
| 2010/0263725 A1 | 10/2010 | Schmidt | |
| 2012/0091566 A1* | 4/2012 | Engelhart et al. | 257/629 |
| 2012/0180860 A1 | 7/2012 | Ko et al. | |
| 2012/0255605 A1* | 10/2012 | Takeda | 136/256 |

FOREIGN PATENT DOCUMENTS

| | | | |
|---|---|---|---|
| CN | 101952971 A | | 1/2011 |
| CN | 102593240 A | | 7/2012 |
| DE | 10 2007 054 384 A1 | | 5/2009 |
| DE | 10 2009 025 977 A1 | | 12/2010 |
| DE | WO2010145648 | * | 12/2010 |
| JP | 2008-10746 A | | 1/2008 |
| JP | 2011-96701 A | | 5/2011 |
| JP | 2012-253356 A | | 12/2012 |
| WO | WO 2011/033826 A1 | | 3/2011 |

OTHER PUBLICATIONS

Dingemans et al., "Status and prospects of Al2O3-based surface passivation schemes for silicon solar cells", J. Vac. Sci. Technol. Part A, vol. 30, No. 4, Jul./Aug. 2012 (published Jul. 6, 2012), pp. 040802-1-040802-27.

(Continued)

*Primary Examiner* — Bach Dinh
(74) *Attorney, Agent, or Firm* — Birch, Stewart, Kolasch & Birch, LLP

(57) ABSTRACT

A solar cell is discussed. The solar cell includes a semiconductor substrate, a p-type conductive region formed at the semiconductor substrate and including a p-type impurity, and a passivation film formed on the p-type conductive region and including aluminum oxide. The passivation film has a thickness of 7 to 17 Å.

18 Claims, 6 Drawing Sheets

(56) References Cited

OTHER PUBLICATIONS

Richter et al., "Excellent silicon surface passivation with 5 Å thin ALD Al2O3 layers: Influence of different thermal post-deposition treatments", Phys. Status Solidi RRL, vol. 5, No. 5-6, 2011 (published online May 11, 2011), pp. 202-204.

Terlinden et al. "Role of field-effect on c-Si surface passivation by ultrathin (2-20 nm) atomic layer deposited Al2O3", Applied Physics Letters, vol. 96, 2010 (published online Mar. 15, 2010), pp. 112101-1-112101-3.

Richter et al., "Excellent silicon surface passivation with 5 Å thin ALD Al2O3 layers: Influence of different thermal post-deposition treatments," Physica Status Solidi (RRL), vol. 5, No. 5-6, 2011 (published online May 11, 2011), pp. 202-204.

\* cited by examiner

SOLAR CELL AND METHOD OF MANUFACTURING THE SAME

CROSS-REFERENCE TO RELATED APPLICATION

This application claims the priority benefit of Korean Patent Application No. 10-2012-0108061, filed on Sep. 27, 2012 in the Korean Intellectual Property Office, the disclosure of which is incorporated herein by reference.

BACKGROUND OF THE INVENTION

1. Field of the Invention

Embodiments of the invention relate to a solar cell and a method of manufacturing the same, and more particularly to a solar cell having an improved structure and a method of manufacturing the same.

2. Description of the Related Art

Recently, as existing energy resources such as petroleum and coal are running out, interest in alternative energy sources is increasing. In particular, solar cells, which directly convert solar energy into electric energy, are receiving much attention as a next-generation alternative energy source.

In a solar cell, for photoelectric conversion, conductive type regions and electrodes electrically connected thereto may be formed at a semiconductor substrate. In addition, to enhance the characteristics of the solar cell, a passivation film that passivates the conductive type regions, an anti-reflective film, and the like are formed.

In a conventional solar cell, however, the passivation film may be easily deformed or damaged in a process of forming the passivation film or in subsequent processes. Thus, passivation effects may be deteriorated and, accordingly, the characteristics of the solar cell may be deteriorated.

SUMMARY OF THE INVENTION

Embodiments of the invention provide a solar cell with improved characteristics and productivity and a method of manufacturing the same.

In one embodiment of the invention, a solar cell includes a semiconductor substrate, a p-type conductive region formed at the semiconductor substrate and including a p-type impurity, and a passivation film formed on the p-type conductive region and including aluminum oxide. The passivation film has a thickness of 7 to 17 Å.

In another embodiment of the invention, a solar cell includes a semiconductor substrate, a first conductive type region formed at the semiconductor substrate, a second conductive type region formed at the semiconductor substrate to be spaced apart from the first conductive type region, and a passivation film formed on any one of the first and second conductive type regions and including aluminum oxide, wherein the aluminum oxide has a chemical formula $AlO_{1.5+x}$, where $0<x\leq0.5$.

In another embodiment of the invention, a method of manufacturing a solar cell includes forming a p-type conductive region including a p-type impurity at a semiconductor substrate and forming a passivation film including aluminum oxide on the p-type conductive region. The passivation film has a thickness of 7 to 17 Å.

BRIEF DESCRIPTION OF THE DRAWINGS

Details of the embodiments of the invention will be more clearly understood from the following detailed description taken in conjunction with the accompanying drawings, in which.

DETAILED DESCRIPTION OF EMBODIMENTS

Figure 1:
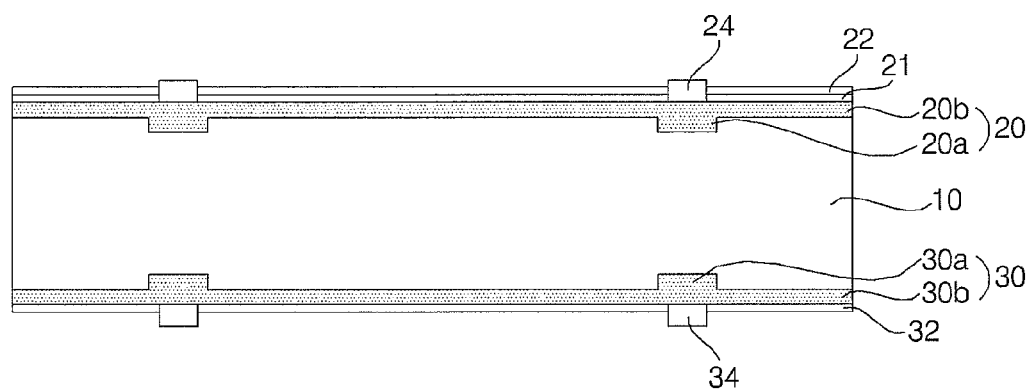
FIG. 1 is a sectional view of a solar cell according to an embodiment of the invention.

Reference will now be made in detail to embodiments of the invention, examples of which are illustrated in the accompanying drawings. However, the invention may be embodied in many different forms and should not be construed as limited to the embodiments set forth herein.

Elements constituting features of the embodiments of the invention are illustrated in the accompanying drawings for clarity of description. Like reference numerals refer to like elements throughout. In the drawings, the widths, thicknesses, etc., of constituent elements may be exaggerated or reduced for clarity and convenience of illustration. The embodiments of the invention are not limited to the illustrated thicknesses, widths, etc.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In addition, in the description of the embodiments of the invention, it will be understood that when a layer (or film), a region, a pad, a pattern or a structure is referred to as being disposed 'on/above/over' another layer, region, pad, pattern or substrate, it can be directly in contact with another layer, region, pad, pattern or substrate, or one or more intervening layers, regions, pads, patterns or structures may also be present. In addition, it will also be understood that when a layer (or film), a region, a pad, a pattern or a structure are referred to as being disposed 'between' two layers, two regions, two pads, two patterns or two structures, it can be the only layer, region, pad, pattern or structure between the two layers, the two regions, the two pads, the two patterns and the two structures or one or more intervening layers, regions, pads, patterns or structures may also be present.

Figure 2:
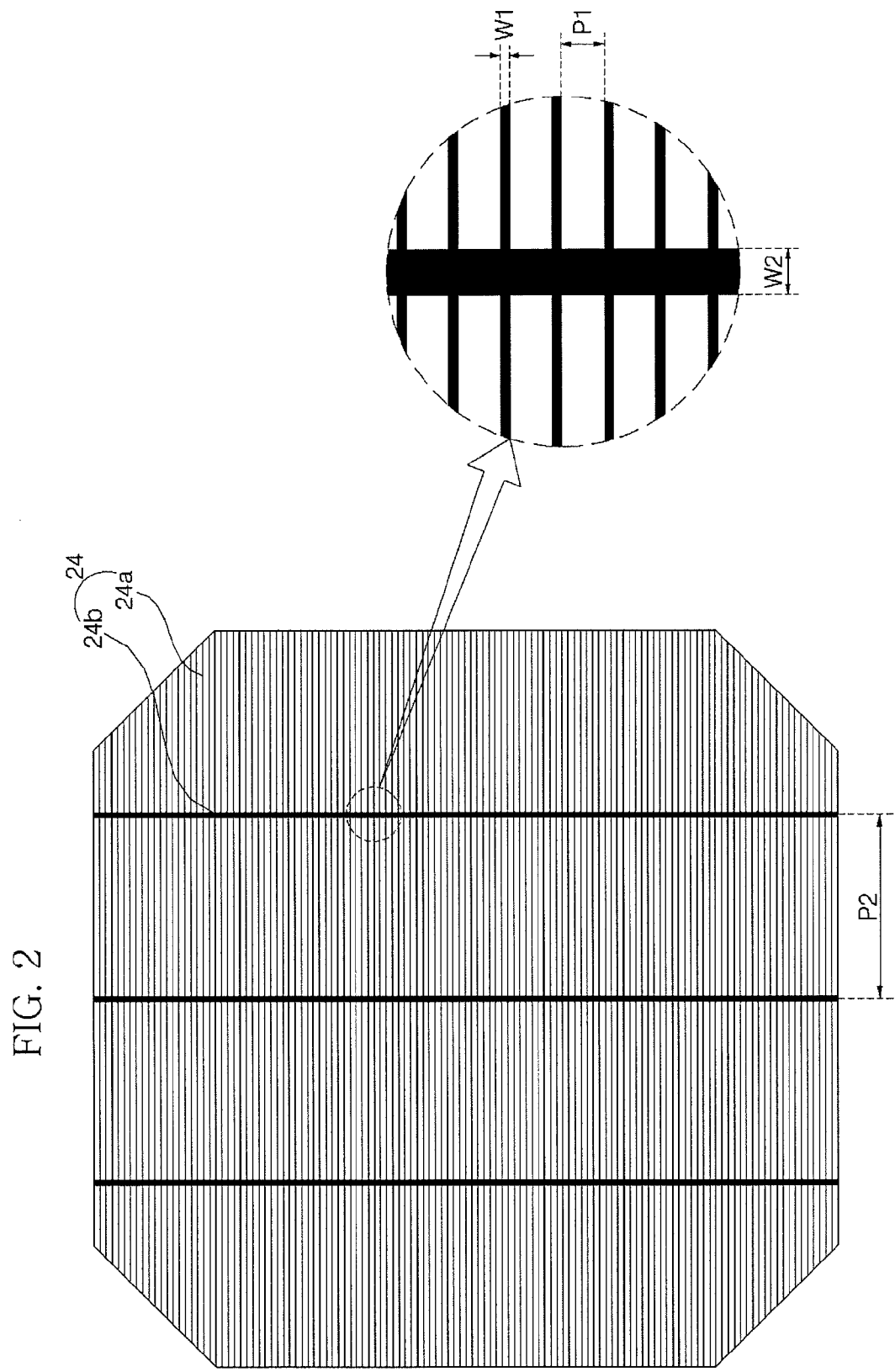
FIG. 2 is a plan view of the solar cell of FIG. 1.

FIG. 1 is a sectional view of a solar cell 100 according to an embodiment of the invention. FIG. 2 is a plan view of the solar cell of FIG. 1.

As illustrated in FIG. 1, the solar cell 100 according to the embodiment of the invention may include a semiconductor substrate 10, conductive type regions 20 and 30 that are formed at the semiconductor substrate 10 and have impurities, and electrodes 24 and 34 that are electrically connected to the conductive type regions 20 and 30, respectively. The conductive type regions 20 and may include an emitter layer 20 and a back surface field layer 30, and the electrodes 24 and 34 may include first electrodes 24 electrically connected to the emitter layer 20 and second electrodes 34 electrically connected to the back surface field layer 30. The solar cell 100 may further include a first passivation film 21, an anti-reflective film 22, a second passivation film 32, and the like. Hereinafter, these elements will be described in detail.

The semiconductor substrate 10 may be formed or include various semiconductor materials, for example, silicon containing a second conductive type impurity. The silicon may be mono-crystalline silicon or polycrystalline silicon, and the second conductive type impurity may be, for example, an n-type impurity. That is, the semiconductor substrate 10 may be made of mono-crystalline or polycrystalline silicon doped with a Group V element such as phosphorus (P), arsenic (As), bismuth (Bi), antimony (Sb), or the like.

When the semiconductor substrate 10 containing an n-type impurity is used, the emitter layer 20 containing a p-type impurity is formed at a front surface of the semiconductor substrate 10 to form a pn junction. When the pn junction is irradiated with light, electrons generated by the photoelectric effect move towards a back surface of the semiconductor substrate 10 and are collected by the second electrodes 34, and holes move towards a front surface of the semiconductor substrate 10 and are collected by the first electrodes 24. Through this process, electrical energy is generated. In this regard, holes which move more slowly than electrons move towards the front surface of the semiconductor substrate 10, not towards the back surface thereof, whereby conversion efficiency may be improved.

At least one of the front and back surfaces of the semiconductor substrate 10 may be textured to have an uneven portion in the form of protrusions, depressions, a pyramid, or the like. Through the texturing process, the uneven portion is formed at the front surface of the semiconductor substrate 10 and thus surface roughness thereof increases, whereby reflectance of light incident on the front surface of the semiconductor substrate 10 may be reduced. Accordingly, the amount of light reaching the pn junction formed at an interface between the semiconductor substrate 10 and the emitter layer 20 may be increased and, consequently, light loss may be minimized.

The emitter layer 20 having a first conductive type impurity may be formed at the front surface of the semiconductor substrate 10. In the embodiment of the invention, as the first conductive type impurity of the emitter layer 20, a p-type impurity such as a Group III element, e.g., boron (B), aluminum (Al), gallium (Ga), indium (In), or the like, may be used.

In this regard, the emitter layer 20 may have first portions 20a having a high impurity concentration and a relatively low resistance and second portions 20b having a lower impurity concentration than that of the first portions 20a and a relatively high resistance. The first portions 20a partially or completely (i.e., at least partially) contacts the respective first electrodes 24.

As described above, in the embodiment of the invention, each of the second portions 20b having a relatively high resistance is formed in a region between the first electrodes 24 through which light is incident, thereby obtaining a shallow emitter. Accordingly, current density of the solar cell 100 may be increased. In addition, the first portions 20a having a relatively low resistance are respectively formed adjacent to the first electrodes 24, thereby reducing contact resistance thereof with the first electrode 24. That is, the emitter layer 20 has a selective emitter structure and thus the solar cell 100 may have maximized efficiency.

However, the embodiments of the invention are not limited thereto. For example, the emitter layer 20 may have a homogeneous emitter structure having uniform doping concentration. In addition, in the embodiment of the invention, the emitter layer 20 is formed only on the front surface of the semiconductor substrate 10, but is not limited thereto. That is, the emitter layer 20 may be formed at the back surface of the semiconductor substrate 10 and thus the solar cell 100 may be of a bottom electrode type.

The emitter layer 20 may be formed by thermal diffusion, ion implantation, or the like, but the embodiments of the invention are not limited thereto. That is, the disclosure may be modified or formed in a variety of ways.

On the semiconductor substrate 10, more particularly, on the emitter layer 20 that is on the semiconductor substrate 10, is formed the first passivation film 21, the anti-reflective film 22, and the first electrodes 24.

The first passivation film 21 and the anti-reflective film 22 may be formed on substantially the entire surface of the semiconductor substrate 10, not on regions of the front surface of the semiconductor substrate 10 on which the first electrodes 24 are formed.

In the embodiment of the invention, the first passivation film 21 inactivates defects present at the surface or bulk of the emitter layer 20, which is a p-type conductive region. Accordingly, recombination sites of minority carriers are removed and thus the open circuit voltage (Voc) of the solar cell 100 may be increased.

In the embodiment of the invention, the first passivation film 21 may be formed or include aluminum oxide to be suitable for passivation of the emitter layer 20, which is a p-type conductive region. That is, the first passivation film 21 including aluminum oxide may be formed between the emitter layer 20 and the anti-reflective film 22, to prevent or reduce positive charges from being generated by the anti-reflective film 22. Thus, the emitter layer 20, which is a p-type conductive region, may be effectively passivated.

Figure 3:
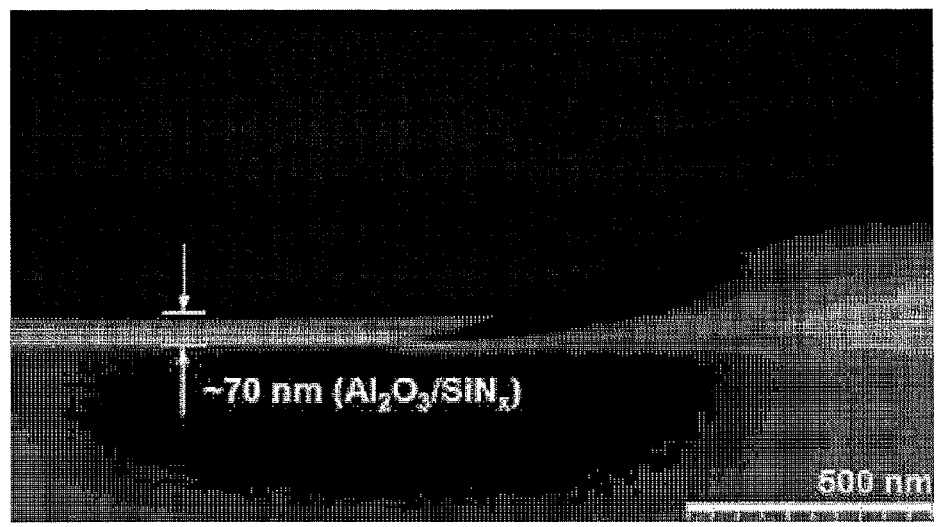
FIG. 3 is a photograph showing a section of a solar cell in which blistering occurs in a passivation film including aluminum.

In the embodiment of the invention, the first passivation film 21 including aluminum oxide may have a thickness of 7 to 17 Å. The thickness of the first passivation film 21 is considerably smaller than the thickness of a conventional passivation film, which is approximately 100 Å. When the thickness of the first passivation film 21 including aluminum oxide is as thick as approximately 100 Å, aluminum oxide may have a stable atomic arrangement in the first passivation layer 21 and, accordingly, aluminum oxide has chemical formula $Al_2O_3$. Even though aluminum oxide having chemical formula $Al_2O_3$ itself has stable atomic arrangement, the aluminum oxide may cause blistering to easily occur in a process of forming the first passivation film 21 or in subsequent processes (in particular, a heat treatment process). FIG. 3 is a photograph showing a section of a solar cell in which such blistering occurs. Referring to FIG. 3, it can be confirmed that blistering occurs in a right side of FIG. 3. When such blistering occurs, the first passivation film 21 is inflated and thus it is difficult to exhibit sufficient passivation effects and, accordingly, a fill factor of the solar cell 100 may be reduced. Therefore, in the embodiment of the invention, the thickness of the first passivation film 21 is adjusted to be far smaller than 100 Å.

In this regard, when the thickness of the first passivation film 21 including aluminum oxide is as small as 7 to 17 Å, it is difficult for the aluminum oxide to have a stable atomic arrangement due to a difference between the size of atoms constituting the first passivation film 21 and the size of atoms (e.g., silicon) constituting the semiconductor substrate 10. Accordingly, the aluminum oxide has chemical formula $AlO_{1.5+x}$ where $0<x\leq0.5$, more particularly, $0.001\leq x\leq 0.5$. In the first passivation film 21 including aluminum oxide having chemical formula $AlO_{1.5+x}$ where $0<x\leq0.5$, more particularly, $0.001\leq x\leq 0.5$, blistering rarely occurs. Thus, the thickness of the first passivation film 21 may be appropriately adjusted to prevent or reduce blistering.

In addition, when the thickness of the first passivation film 21 is 7 to 17 Å, the first passivation film 21 exhibits the same or similar passivation effects to those of an existing passivation film having a thickness of approximately 100 Å and including $Al_2O_3$. This is predicted because although the first passivation film 21 is unable to contribute to generation of negative charges due to its relatively small thickness, the first passivation film 21 sufficiently exhibits an effect of preventing positive charge generation by passivating hydrogen contained in the anti-reflective film 22 formed on the first passivation film 21.

The first passivation film 21 including the above-described aluminum oxide may be formed by atomic layer deposition (ALD). ALD is a technique of forming a film of aluminum oxide by depositing atomic layers one after another, and may be used to form a film having a high surface defect density, high film density, and high stability. When the thickness of a film increases by depositing atomic layers one after another, however, manufacturing time may also significantly increase. In the embodiment of the invention, the first passivation film 21 may have a significantly decreased thickness and thus the number of ALD processes may be significantly decreased and the amount of a raw material (e.g., trimethylaluminum (TMA)) used may also be significantly decreased. For example, when the thickness of the first passivation film 21 is 10 Å, the thickness thereof may be 90% smaller than that of an existing passivation film and, accordingly, the number of cycles of ALD and manufacturing costs may also be reduced by 90%.

For example, the number of cycles of ALD for formation of the first passivation film 21 may be 5 to 15, which is far smaller than the existing number of cycles, i.e., 80. However, the number of cycles may vary according to ALD process conditions, and thus, the embodiments of the invention are not limited thereto.

That is, in the embodiment of the invention, the thickness of the first passivation film 21 may be adjusted to 7 to 17 Å, whereby occurrence of blistering may be prevented or reduced, manufacturing time may be decreased, and passivation effects may be sufficiently obtained. Therefore, the solar cell 100 may have improved productivity and characteristics.

The anti-reflective film 22 reduces the reflectance of light incident through the front surface of the semiconductor substrate 10. Accordingly, it is possible to increase the amount of light reaching the pn junctions formed at the interface between the semiconductor substrate 10 and the emitter layer 20. Thus, short-circuit current Isc of the solar cell 100 can be increased.

The anti-reflective film 22 may be formed of various materials. For example, the anti-reflective film 22 may have a single-layer structure of any one film selected from the group consisting of a silicon nitride film, a silicon nitride film containing hydrogen, a silicon oxide film, a silicon oxide nitride film, an $MgF_2$ film, a ZnS film, a $TiO_2$ film, and a $CeO_2$ film, or a multi-layered structure of at least two of these films. For example, the anti-reflective film 22 may be a silicon nitride film. However, the embodiments of the invention are not limited to the above examples, and the anti-reflective film 22 may be formed or include various materials.

The anti-reflective film 22 may be formed using various methods, such as vacuum deposition, chemical vapor deposition, spin coating, screen-printing, spray coating, or the like.

The first electrodes 24 are electrically connected to the emitter layer 20 via openings (i.e., through the anti-reflective film 22) formed in the first passivation film 21 and the anti-reflective film 22. The first electrodes 24 may be formed to have various shapes and a detailed description thereof will be given below.

The openings are formed in the first passivation film 21 and the anti-reflective film 22, and the first electrodes 24 may be formed at the openings using various methods such as plating, deposition, or the like. Alternatively, the first electrodes 24 may be formed by coating a paste for forming the first electrode 24 on the anti-reflective film 22 by screen-printing or the like and performing a fire-through process or a laser firing contact process thereon. In this regard, a separate process for forming openings is not needed.

The semiconductor substrate 10 is provided at a back surface thereof with the back surface field layer 30 containing a second conductive type impurity at a higher doping concentration than the semiconductor substrate 10.

The back surface field layer 30 containing a second conductive type impurity may be formed at the back surface of the semiconductor substrate 10. In the embodiment of the invention, the back surface field layer 30 may include, as the second conductive type impurity, an n-type impurity such as a Group V element, e.g., P, As, Bi, Sb, or the like.

In the embodiment of the invention, the back surface field layer 30 may have first portions 30a having a high impurity concentration and a relatively low resistance and second portions 30b having a lower impurity concentration than that of the first portions 30a and a relatively high resistance. Each of the first portions 30a is formed to partially or completely (i.e., at least partially) contact the first electrode 34.

In this regard, each of the second portions 30b having a relatively high resistance is formed in a region between the second electrodes 34, whereby recombination between holes and electrons may be prevented or reduced. Accordingly, current density of the solar cell 100 may be increased. In addition, the first portions 30a with a relatively low resistance are respectively formed in regions adjacent to the second electrodes 34, whereby contact resistance thereof with the second electrodes 34 may be reduced. That is, the back surface field layer 30 according to the embodiment of the invention may have a selective back surface field structure, whereby the solar cell 100 may have maximized efficiency.

However, the embodiments of the invention are not limited to the above examples and, for example, the back surface field layer 30 may have a homogeneous back surface field structure having a homogeneous doping concentration. Alternatively, the back surface field layer 30 may have a local back surface field structure in which the back surface field layer 30 is locally formed at the back surface of the semiconductor substrate 10. The back surface field layer 30 having a local back surface field structure will be described below with reference to FIG. 4.

The back surface field layer 30 may be formed by thermal diffusion, ion implantation, or the like. However, the embodiments of the invention are not limited to the above examples, and the back surface field layer 30 may be modified or formed in a variety of ways.

The second passivation film 32 and the second electrodes 34 may be formed at the back surface of the semiconductor substrate 10.

The second passivation film 32 may be formed on substantially the entire back surface of the semiconductor substrate 10, except for regions where the second electrodes 34 are formed. The second passivation film 32 may inactivate defects present in the back surface of the semiconductor substrate 10, thereby removing recombination sites of minority carriers. Thus, the open circuit voltage of the solar cell 100 may be increased.

The second passivation film 32 may be made of a transparent insulating material, to allow light to pass therethrough. Accordingly, light can be incident upon the back surface of the semiconductor substrate 10 through the second passivation film 32 and, as such, the efficiency of the solar cell 100 may be enhanced. For example, the second passivation film 32 may have a single-layer structure of any one film selected from the group consisting of a silicon nitride film, a silicon nitride film containing hydrogen, a silicon oxide film, a silicon oxide nitride film, an aluminum oxide film, an $MgF_2$ film, a ZnS film, a $TiO_2$ film, and a $CeO_2$ film, or a multi-layered structure of at least two of these films. However, the embodiments of the invention are not limited to the above examples, and the second passivation film 32 may be formed or include various materials.

The second passivation film 32 may be formed using various methods such as vacuum deposition, chemical vapor deposition, spin coating, screen-printing, spray coating, or the like.

The second electrodes 34 are electrically connected to the back surface field layer 30 via openings formed in the second passivation film 32 (i.e., through the second passivation film 32). The second electrodes 34 may be formed to have various shapes.

The openings are formed in the second passivation film 32, and the second electrodes 34 may be formed at the respective openings using various methods such as plating, deposition, or the like. Alternatively, the second electrodes 34 may be formed by coating a paste for forming the second electrodes 34 on the second passivation film 32 by screen printing or the like and performing a fire-through process or a laser firing contact process thereon. In this regard, a separate process of forming openings is not needed. As described above, the first electrodes 24 and/or the second electrodes 34 may have various planar shapes. An example thereof will now be described with reference to FIG. 2. The first electrodes 24 and the second electrodes 34 may have different widths and pitches, but basic shapes thereof may be similar to each other. Thus, a detailed description of the first electrodes 24 illustrated in FIG. 2 will be focused upon in the following description, and a detailed description of the second electrodes 34 will not be repeated. The following description may be equally applied to the first and second electrodes 24 and 34.

Referring to FIG. 2, each first electrode 24 may include a plurality of finger electrodes 24a arranged in parallel and each having a first pitch P1. In addition, each first electrode 24 may include bus bar electrodes 24b that are formed in a direction crossing the finger electrodes 24a and that connect the finger electrodes 24a to one another. In this regard, a single bus bar electrode 24b may be disposed, or, as illustrated in FIG. 2, plural bus bar electrodes 24b each having a second pitch P2 that is greater than the first pitch P1 may be disposed. The bus bar electrode 24b may have a width W2 that is greater than a width W1 of the finger electrode 24a, but the embodiments of the invention are not limited thereto. For example, the bus bar electrode 24b and the finger electrode 24a may have the same width. The shape of the first electrodes 24 is provided for illustrative purposes only, and the embodiments of the invention are not limited thereto.

As seen in a sectional view, both the finger electrodes 24a and the bus bar electrodes 24b may be formed through the first passivation film 21 and the anti-reflective film 22 (through the second passivation film 32 in the case of the second electrodes 34). Alternatively, the finger electrodes 24a may be formed through the first passivation film 21 and the anti-reflective film 22 and the bus bar electrodes 24b may be formed on the anti-reflective film 22.

As described above, in the embodiment of the invention, the first passivation film 21 that is a p-type conductive type region and passivates the emitter layer 20 includes aluminum oxide having chemical formula $AlO_{1.5+X}$ where $0<x\leq0.5$ and has a thickness of 7 to 17 Å. Accordingly, the first passivation film 21 may exhibit excellent passivation effects, manufacturing costs and time for formation of the first passivation film 21 may be reduced, and occurrence of blistering may be prevented or reduced. As a result, the solar cell 100 may have improved characteristics and productivity.

In the above-described embodiment, the first passivation film 21 that passivates the emitter layer 20 disposed at the front surface of the semiconductor substrate 10 includes aluminum oxide having chemical formula $AlO_{1.5+X}$ where $0<x\leq0.5$ and has a thickness of 7 to 17 Å. However, the embodiments of the invention are not limited to the above example. That is, the second passivation film 32 that passivates the back surface field layer 30 may include aluminum oxide having chemical formula $AlO_{1.5+X}$ where $0<x\leq0.5$ and has a thickness of 7 to 17 Å. Alternatively, a passivation film that passivates a p-type conductive region disposed at the back surface of the semiconductor substrate 10 may include aluminum oxide having chemical formula $AlO_{1.5+X}$ where $0<x\leq0.5$ and have a thickness of 7 to 17 Å. Embodiments thereof will now be described with reference to FIGS. 4 to 6.

Figure 4:
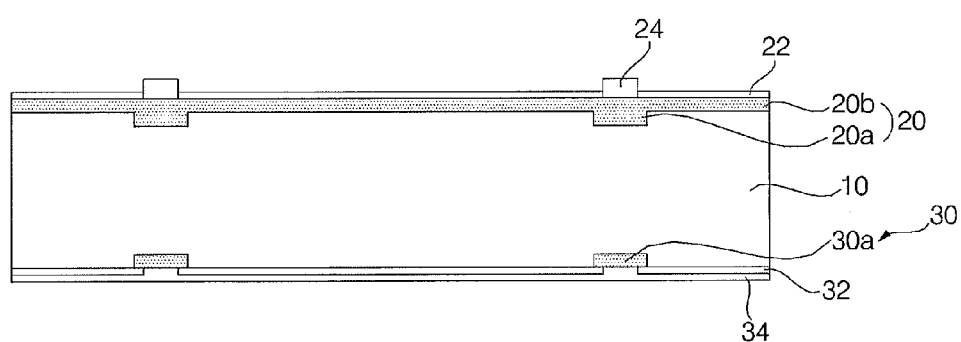
FIG. 4 is a sectional view of a solar cell according to another embodiment of the invention.

FIG. 4 is a sectional view of a solar cell 102 according to another embodiment of the invention.

Referring to FIG. 4, the solar cell 102 may include a semiconductor substrate 10, an emitter layer 20 and a back surface field layer 30 that are formed at the semiconductor substrate 10 and have impurities, and first electrodes 24 and a second electrode 34 that are electrically connected to the emitter layer 20 and the back surface field layer 30, respectively. In addition, the solar cell 102 may further include an anti-reflective film 22, a second passivation film 32, and the like. This will now be described in more detail.

In the embodiment of the invention, different from the embodiment illustrated in FIG. 1, the semiconductor substrate 10 and the back surface field layer 30 are p-type, and the emitter layer 20 is n-type. Accordingly, the back surface field layer 30 forms a p-type conductive region, and the emitter layer 20 forms an n-type conductive region. Types of impurities allowing these layers to be n-type or p-type are the same as described above, and thus a detailed description thereof is not repeated.

A front surface of the semiconductor substrate 10 may be provided with irregularities formed by a texturing process.

The anti-reflective film 22 may be formed of various materials. For example, the anti-reflective film 22 may have a single-layer structure of any one film selected from the group consisting of a silicon nitride film, a silicon nitride film containing hydrogen, a silicon oxide film, a silicon oxide nitride film, an aluminum oxide film, an $MgF_2$ film, a ZnS film, a $TiO_2$ film, and a $CeO_2$ film, or a multi-layered structure of at least two of these films. For example, the anti-reflective film 22 may be a silicon nitride film. However, the embodiments of the invention are not limited to the above examples, and the anti-reflective film 22 may be formed or include various materials. In addition, the solar cell 102 may further include a first passivation film disposed between the semiconductor substrate 10 and the anti-reflective film 22.

The back surface field layer 30 includes only first portions 30a respectively formed in contact regions corresponding to the second electrode 34. The second electrode 34 is formed on the entire surface of the second passivation film 32 and is electrically connected to the first portions 30a of the back surface field layer 30 via openings formed in the second passivation film 32. That is, in the embodiment of the invention, the second electrode 34 may be in point contact with the first portions 30a of the back surface field layer 30.

In this regard, the second passivation film 32 that passivates the back surface field layer 30, which is a p-type conductive region, includes aluminum oxide having chemical formula $AlO_{1.5+X}$ where $0<x\leq0.5$, more particularly, $0.001\leq x\leq0.5$, and has a thickness of 7 to 17 Å. The chemical formula and thickness has already been described above with regards to the embodiment illustrated in FIG. 1 and thus a detailed description thereof is not repeated.

By such structure of the back surface field layer 30 and the second electrode 34, back surface field effects may be enhanced and reflectance of the second electrode 34 may be increased, whereby the efficiency of the solar cell 102 may be improved. In addition, the second passivation film 32 that is a p-type conductive region and passivates the back surface field layer 30 includes aluminum oxide having chemical formula $AlO_{1.5+X}$ where $0<x\leq0.5$, more particularly, $0.001\leq x\leq0.5$ and has a thickness of 7 to 17 Å. Accordingly, the second passivation film 32 may exhibit excellent passivation effects, manufacturing costs and time for formation of the second passivation film 32 may be reduced, and occurrence of blistering may be prevented or reduced. As a result, the solar cell 102 may have improved characteristics and productivity.

The back surface field layer 30, the second passivation film 32, and the second electrode 34 may be formed using various methods. That is, the second passivation film 32 may be formed on a back surface of the semiconductor substrate 10 at which the back surface field layer 30 has not yet been formed, and a paste for forming the second electrode 34 (e.g., Al paste) may be applied to the second passivation film 32 to form the second electrode 34 electrically connected to the back surface field layer 30 by laser firing contact, or the like. In this regard, an impurity (e.g., Al) in the paste for forming the second electrode 34 may be diffused into the semiconductor substrate 10 to form the first portions 30a of the back surface field layer 30 which are locally formed in regions adjacent to the second electrode 34. Alternatively, the back surface of the semiconductor substrate 10 may be doped with an impurity using various methods to form the back surface field layer 30, the second passivation film 32 may be formed on the back surface of the semiconductor substrate 10, openings may be formed in the second passivation film 32, and then the second electrode 34 may be formed on the second passivation film 32. In addition, various other methods may also be used.

Figure 5:
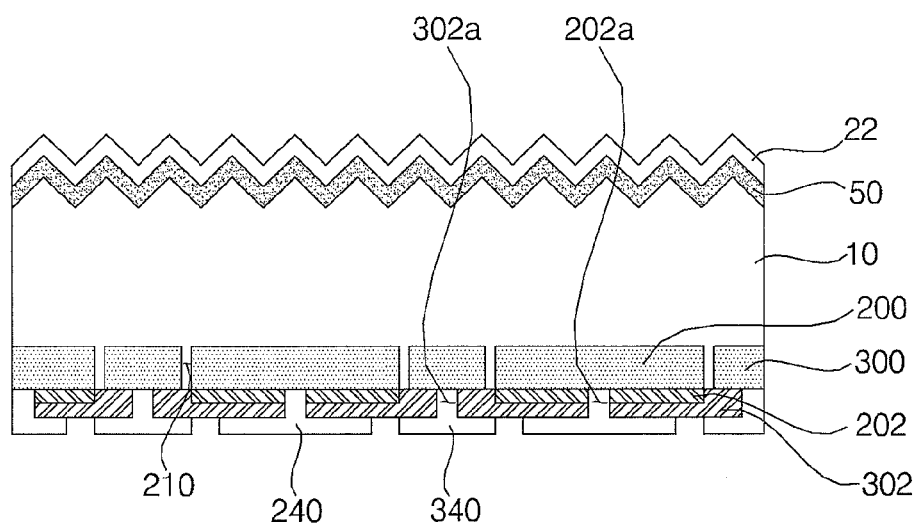
FIG. 5 is a sectional view of a solar cell according to another embodiment of the invention.
Figure 6:
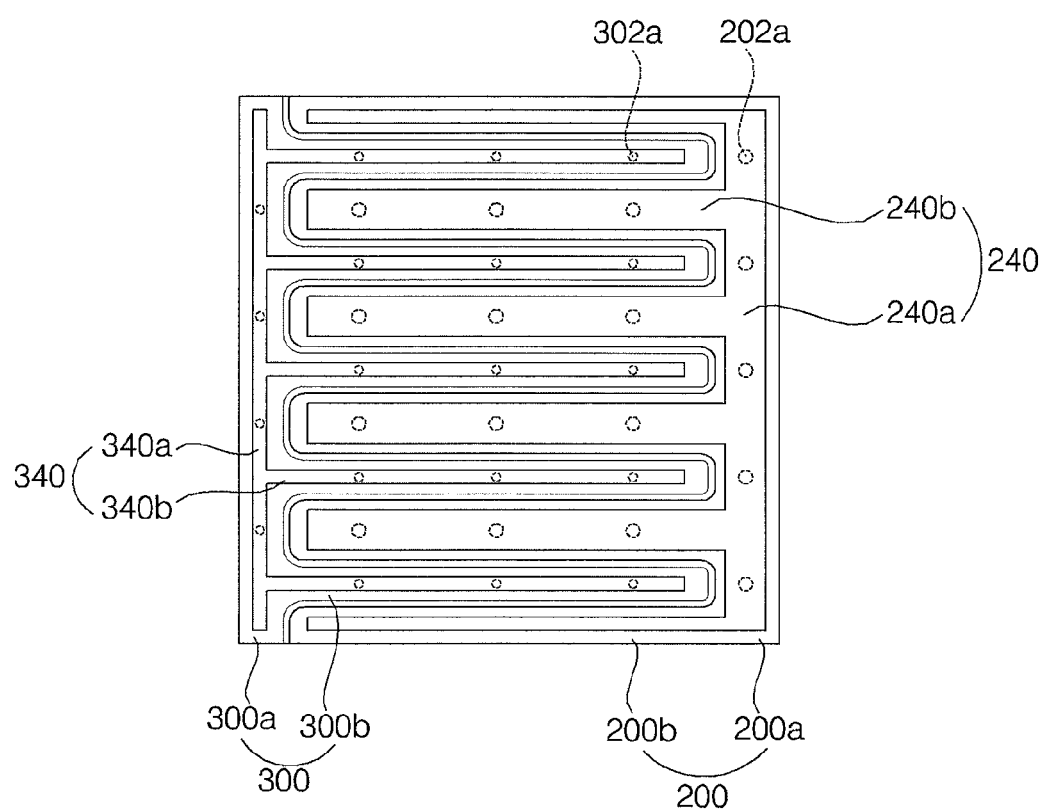
FIG. 6 is a rear plan view of first and second conductive type regions and first and second electrodes of a solar cell according to an embodiment of the invention.

FIG. 5 is a sectional view of a solar cell 104 according to another embodiment of the invention. FIG. 6 is a rear plan view of first and second conductive type regions and first and second electrodes of a solar cell according to an embodiment of the invention. In FIG. 6, first and second passivation films are not illustrated for clarity of illustration.

Referring to FIG. 5, the solar cell 104 includes a semiconductor substrate 10, first and second conductive type regions 200 and 300 formed at a back surface of the semiconductor substrate 10, first and second passivation films 202 and 302, and first and second electrodes 240 and 340. In addition, the solar cell 104 may further include a front surface field layer 50 and an anti-reflective film 22 that are formed at a front surface of the semiconductor substrate 10. This will now be described in more detail.

The semiconductor substrate 10 may be, for example, n-type, but the embodiments of the invention are not limited thereto. That is, the semiconductor substrate 10 may be p-type. Types of impurities allowing the semiconductor substrate 10 to be n-type or p-type are the same as described above and thus a detailed description thereof is not repeated.

The semiconductor substrate 10 may be provided at the front surface thereof with irregularities in the form of protrusions, such as a pyramid, by a texturing process.

The front surface field layer 50 may be formed at the front surface of the semiconductor substrate 10. The front surface field layer 50 is a region doped with an impurity at a higher concentration than that of the semiconductor substrate 10, and functions similarly to a back surface field (BSF) layer. That is, the front surface field layer 50 enables electrons and holes that are decomposed by incident sunlight to be recombined at the front surface of the semiconductor substrate 10 and thus prevents or reduces the electrons and holes from disappearing.

The anti-reflective film 22 may be formed on the front surface field layer 50. The anti-reflective film 22 may be formed on the entire front surface of the semiconductor substrate 10. The anti-reflective film 22 reduces reflectance of light incident through the front surface of the semiconductor substrate 10 and inactivates defects present in the surface or bulk of the front surface field layer 50.

The anti-reflective film 22 may be formed of various materials. For example, the anti-reflective film 22 may have a single-layer structure of any one film selected from the group consisting of a silicon nitride film, a silicon nitride film containing hydrogen, a silicon oxide film, a silicon oxide nitride film, an aluminum oxide film, an $MgF_2$ film, a ZnS film, a $TiO_2$ film, and a $CeO_2$ film, or a multi-layered structure of at least two of these films. However, the embodiments of the invention are not limited to the above examples, and the anti-reflective film 22 may be formed or include various materials.

The first and second conductive type regions 200 and 300 that have different conductive type dopants, i.e., p-type and n-type dopants, respectively, are formed at the back surface of the semiconductor substrate 10. The first and second conductive type regions 200 and 300 may be spaced apart from each other with an isolation region 210 disposed therebetween so as to prevent shunting. The first and second conductive type regions 200 and 300 may be spaced apart by the isolation region 210 by a constant distance (e.g., tens of micrometers (μm) to hundreds of micrometers (μm)). The first and second conductive type regions 200 and 300 may have the same thickness or different thicknesses. However, the embodiments of the invention are not limited as to the distance between the first and second conductive type regions 200 and 300 or the thickness thereof.

The first conductive type regions 200 may be formed by ion implantation of a p-type impurity, and the second conductive type regions 300 may be formed by ion implantation of an n-type impurity. However, the embodiments of the invention are not limited to the above examples. Alternatively, a layer having a p-type impurity and formed of amorphous silicon and a layer having an n-type impurity and formed of amorphous silicon may be formed on the back surface of the semiconductor substrate 10 to form the first and second conductive type regions 200 and 300. In addition, the first and second conductive type regions 200 and 300 may be formed using various other methods.

Referring to FIG. 6, the first conductive type region 200 may include a first stem part 200a formed to extend along a first edge of the semiconductor substrate 10 and a plurality of first branch parts 200b extending towards a second edge opposite to the first edge from the first stem part 200a. The second conductive type region 300 may include a second stem part 300a formed to extend along the second edge of the semiconductor substrate 10 and a plurality of second branch parts 300b extending towards the first edge from the second stem part 300a. Each of the second branch parts 300b extends towards between adjacent ones of the first branch parts 200b. By such structure, a pn junction area may be increased. The first and second conductive type regions 200 and 300 may be interdigitated.

In this regard, the first conductive type region 200, which is p-type, may have a larger area than that of the second conductive type region 300, which is n-type. For example, the areas of the first and second conductive type regions 200 and 300 may be adjusted by varying widths of the first and second stem parts 200a and 240a and/or the first and second branch parts 200b and 240b thereof.

In the embodiment of the invention, carriers are collected only at the back surface of the semiconductor substrate 10 and thus the semiconductor substrate 10 has a relatively large horizontal distance relative to the thickness of the semiconductor substrate 10. In this regard, movement of holes is relatively slower than movement of electrons and thus the area of the first conductive type region 200, which is p-type, may be adjusted to be larger than that of the second conductive type region 300, which is n-type. Taking into consideration the fact that a ratio of movement rates of electrons to holes is about 3:1, the area of the first conductive type region 200 may be two to six times greater than that of the second conductive type region 300. That is, such area ratio is needed to optimize design of the first and second conductive type regions 200 and 300 by considering movement rates of electrons and holes.

Referring back to FIG. 5, first passivation films 202 may be formed on the respective first conductive type regions 200 to directly contact the first conductive type regions 200. That is, in the embodiment of the invention, the solar cell 104 includes the first passivation films 202 having the same planar shape as that of the first conductive type regions 200 and contacting only the first conductive type regions 200. Accordingly, as seen in a plan view, the first passivation film 202 may include a portion corresponding to the first stem part 200a (see FIG. 6) and portions corresponding to the first branch parts 200b (see FIG. 6).

When the first passivation films 202 have the same planar shape as the first conductive type regions 200, the first passivation films 202 may be formed using a mask used for formation of the first conductive type regions 200. Accordingly, costs for such masks may be reduced.

The first passivation films 202 inactivates defects present in the back surface of the semiconductor substrate 10 (i.e., the surfaces of the first conductive type regions 200) to remove recombination sites of minority carriers. Therefore, the open circuit voltage (Voc) of the solar cell 104 may be increased. In this regard, the first passivation films 202 passivating the first conductive type regions 200, which is a p-type conductive region, include aluminum oxide having chemical formula $AlO_{1.5+x}$ where $0<x\leq 0.5$, more particularly, $0.001\leq x\leq 0.5$, and have a thickness of 7 to 17 Å. The chemical formula and thickness has already been described in detail with regards to the embodiment illustrated in FIG. 1 and thus a detailed description thereof is not repeated.

The second passivation film 302 may be formed on the second conductive type regions 300 to directly contact the second conductive type regions 300. In this embodiment, the second passivation film 302 may be formed on the entire back surface of the semiconductor substrate 10 such that the second passivation film 302 is formed on the second conductive type regions 300 and directly formed on the first passivation films 202. When the second passivation film 302 is entirely formed in such manner, the second passivation film 302 may be formed without a separate patterning process or without using a separate mask, thereby simplifying the manufacturing processes.

The second passivation film 302 may be formed or include a different material from that of the first passivation films 202, i.e., a material suitable for passivation of the second conductive type regions 300, which is n-type. For example, the second passivation film 302 may be formed or include at least one material selected from the group consisting of silicon oxide, silicon nitride, silicon oxide nitride, $MgF_2$, ZnS, $TiO_2$, and $CeO_2$.

However, the embodiments of the invention are not limited to the above examples. That is, the first passivation film 202 may cover both the first and second conductive type regions 200 and 300 without the second passivation film 302.

The first electrode 240 connected to each first conductive type region 200 may be formed on the first passivation film 202, and the second electrode 340 connected to each second conductive type region 300 may be formed on the second passivation film 302. More particularly, the first electrodes 240 may be respectively connected to the first conductive type regions 200 through first through holes 202a penetrating the first and second passivation films 202 and 302, and the second electrodes 340 may be respectively connected to the second conductive type regions 300 via second through holes 302a penetrating the second passivation film 302.

In this regard, as illustrated in FIG. 6, the first electrode 240 may include a stem part 240a formed corresponding to the first stem part 200a of the first conductive type region 200 and branch parts 240b formed corresponding to the first branch parts 200b of the first conductive type region 200. Similarly, the second electrode 340 may include a stem part 340a formed corresponding to the second stem part 300a of the second conductive type region 300 and branch parts 340b formed corresponding to the second branch parts 300b of the second conductive type region 300. However, the embodiments of the invention are not limited to the above example, and the first and second electrodes 240 and 340 may have various planar shapes.

In the embodiment of the invention, the first and second electrodes 240 and 340 are not disposed at a front surface of the solar cell 104 and thus light loss may be minimized, which results in improved efficiency of the solar cell 104. In addition, the first passivation films 202 that respectively passivate the first conductive type regions 200, which is p-type conductive type regions, include aluminum oxide having chemical formula $AlO_{1.5+x}$ where $0<x\leq 0.5$, more particularly, $0.001\leq x\leq 0.5$, and have a thickness of 7 to 17 Å. Accordingly, the first passivation films 202 may retain excellent passivation effects, manufacturing costs and time for formation of the first passivation films 202 may be reduced, and occurrence of blistering may be prevented or reduced. As a result, the solar cell 104 may have improved characteristics and productivity.

One or more embodiments of the invention will now be described more fully with reference to the following examples. However, these examples are provided for illustrative purposes only and are not intended to limit the scope of the embodiments of the invention.

Experimental Example

An n-type semiconductor substrate was prepared. A front surface of the n-type semiconductor substrate was doped with boron (B) to form an emitter layer. A back surface of the n-type semiconductor substrate was doped with phosphorus (P) to form a back surface field layer. A first passivation film was formed on the front surface of the semiconductor substrate using atomic layer deposition (ALD), an anti-reflective film including a silicon nitride film was formed thereon, and a second passivation film including a silicon oxide film and a silicon nitride film was formed on the back surface of the semiconductor substrate. Thereafter, first electrodes electrically connected to the emitter layer and second electrodes electrically connected to the back surface field layer were formed.

In such manner, manufacture of solar cells including first passivation films having different thicknesses, i.e., 7 Å, 10 Å, 12 Å, 14 Å, and 17 Å, was completed.

Comparative Example

Solar cells including first passivation films having different thicknesses, i.e., 0 Å, 2 Å, 5 Å, 25 Å, and 100 Å were manufactured.

Figure 7:
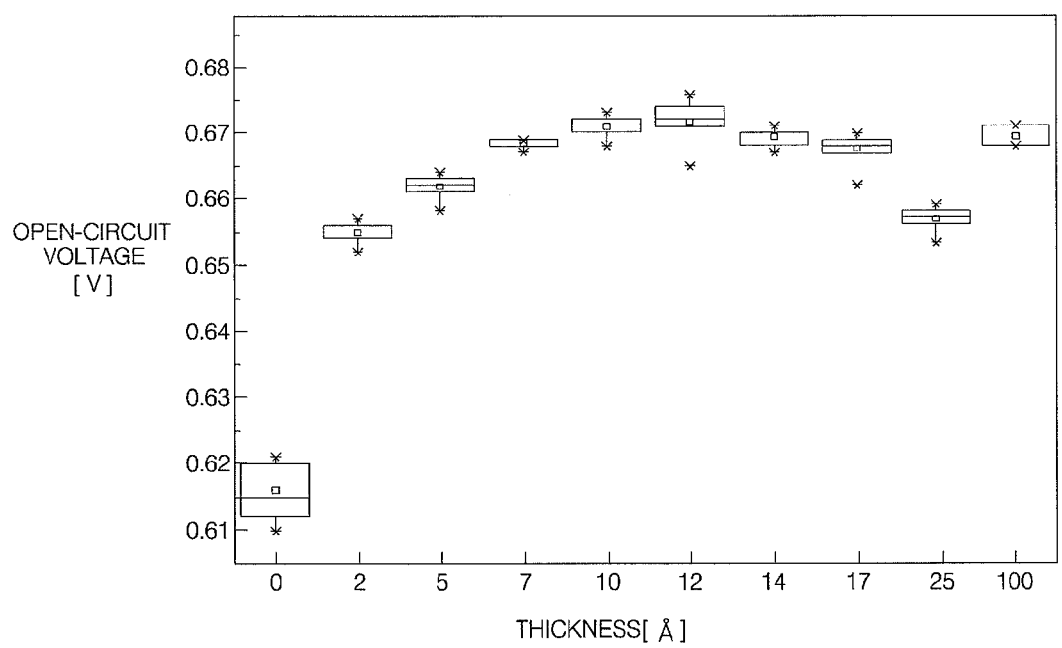
FIG. 7 is a graph showing measurement results of implied open-circuit voltage Voc according to thickness of a first passivation film of each of the solar cells manufactured according to Experimental Example and Comparative Example.

Implied Voc according to the thickness of the first passivation film of each of the solar cells manufactured according to Experimental Example and Comparative Example was measured, and measurement results are shown in FIG. 7.

Referring to FIG. 7, it can be confirmed that the solar cells of Experimental Example including the first passivation films having thicknesses of 7 Å, 10 Å, 12 Å, 14 Å, and 17 Å have Voc that is similar to or higher than that of the solar cell of Comparative Example including the first passivation film having a thickness of 100 Å. As for the solar cells of Comparative Example, when the thickness of the first passivation film is less than 7 Å and greater than 17 Å, Voc is so low that the characteristics of the solar cells may be deteriorated. That is, according to Experimental Example, by reducing the thickness of the first passivation film, manufacturing costs and time may be reduced and open circuit voltage characteristics may be improved. In other words, productivity and efficiency of the solar cell may be improved.

Particular features, structures, or characteristics described in connection with the embodiment of the invention are included in at least one embodiment of the invention and not necessarily in all embodiments of the invention. Furthermore, the particular features, structures, or characteristics of any specific embodiment of the invention may be combined in any suitable manner with one or more other embodiments of the invention or may be changed by those skilled in the art to which the embodiments of the invention pertain. Therefore, it is to be understood that contents associated with such combination or change fall within the spirit and scope of the present disclosure.

Although the invention has been described with reference to a number of illustrative embodiments, it should be understood that numerous other modifications and applications may be devised by those skilled in the art that will fall within the intrinsic aspects of the embodiments of the invention. More particularly, various variations and modifications are possible in concrete constituent elements of the embodiments of the invention. In addition, it is to be understood that differences relevant to the variations and modifications fall within the spirit and scope of the embodiments of the invention defined in the appended claims.

What is claimed is:

1. A solar cell comprising:
   a semiconductor substrate;
   a p-type conductive region formed at the semiconductor substrate and comprising a p-type impurity; and
   a passivation film formed on the p-type conductive region and comprising aluminum oxide,
   wherein the passivation film has a thickness of 7 to 17 Å, and
   wherein the aluminum oxide has a chemical formula of $AlO_{1.5+X}$, where $0<x\leq 0.5$.

2. The solar cell according to claim 1, wherein the aluminum oxide has the chemical formula of $AlO_{1.5+X}$, where $0.001\leq x\leq 0.5$.

3. The solar cell according to claim 1, wherein the p-type conductive region comprises an emitter layer formed at a front surface of the semiconductor substrate, and the passivation film is formed on the emitter layer.

4. The solar cell according to claim 1, wherein the p-type conductive region comprises a back surface field layer formed at a back surface of the semiconductor substrate, and the passivation film is formed on the back surface field layer.

5. The solar cell according to claim 4, further comprising an electrode formed on the passivation film and electrically connected to the p-type conductive region,
   wherein the electrode is entirely formed on the passivation film and is in point contact with the p-type conductive region.

6. The solar cell according to claim 5, wherein the back surface field layer of the p-type conductive region is locally formed in a region adjacent to a portion of the electrode.

7. The solar cell according to claim 1, further comprising an n-type conductive region formed at a back surface of the semiconductor substrate to be spaced apart from the p-type conductive region.

8. The solar cell according to claim 7, wherein the passivation film is formed on the p-type conductive region, and
   the solar cell further comprises another passivation film formed on the back surface of the semiconductor substrate to cover the passivation film and the n-type conductive region.

9. The solar cell according to claim 7, further comprising a front surface field layer formed at a front surface of the semiconductor substrate.

10. A solar cell comprising:
    a semiconductor substrate;
    a first conductive type region formed at the semiconductor substrate;
    a second conductive type region formed at the semiconductor substrate to be spaced apart from the first conductive type region; and
    a passivation film formed on any one of the first and second conductive type regions and comprising aluminum oxide,
    wherein the aluminum oxide has a chemical formula $AlO_{1.5+X}$, where $0<x\leq 0.5$.

11. The solar cell according to claim 10, wherein the aluminum oxide has the chemical formula $AlO_{1.5+X}$ where $0.001\leq x\leq 0.5$.

12. The solar cell according to claim 10, wherein the passivation film has a thickness of 7 to 17 Å.

13. The solar cell according to claim 10, wherein the first conductive type region is formed at a front surface of the semiconductor substrate, and the second conductive type region is formed at a back surface of the semiconductor substrate.

14. The solar cell according to claim 13, wherein the second conductive type region is locally formed in a region adjacent to a portion of the electrode.

15. The solar cell according to claim 10, wherein the first and second conductive type regions are formed at a back surface of the semiconductor substrate to be spaced apart from each other, and
    the solar cell further comprises a front surface field layer formed at a front surface of the semiconductor substrate.

16. A method of manufacturing a solar cell, the method comprising:
    forming a p-type conductive region comprising a p-type impurity at a semiconductor substrate; and
    forming a passivation film comprising aluminum oxide on the p-type conductive region,
    wherein the passivation film has a thickness of 7 to 17 Å, and
    wherein the aluminum oxide has a chemical formula $AlO_{1.5+x}$, where $0<x\leq0.5$.

17. The method according to claim 6, wherein the aluminum oxide has the chemical formula $AlO_{1.5+x}$, where $0.001\leq x\leq 0.5$.

18. The method according to claim 16, wherein the passivation film is formed by atomic layer deposition.

* * * * *